US012655525B2

(12) United States Patent
Lautan et al.

(10) Patent No.: US 12,655,525 B2
(45) Date of Patent: Jun. 16, 2026

(54) COMPOSITION FOR DEPOSITING A PALLADIUM COATING ON A SUBSTRATE

(71) Applicant: Atotech Deutschland GmbH & Co. KG, Berlin (DE)

(72) Inventors: Donny Lautan, Berlin (DE); Dmytro Voloshyn, Berlin (DE); Isabel-Roda Hirsekorn, Berlin (DE); Dirk Tews, Berlin (DE); Robert Spreemann, Berlin (DE)

(73) Assignee: Atotech Deutschland GmbH & Co. KG, Berlin (DE)

( * ) Notice: Subject to any disclaimer, the term of this patent is extended or adjusted under 35 U.S.C. 154(b) by 495 days.

(21) Appl. No.: 18/042,791

(22) PCT Filed: Aug. 31, 2021

(86) PCT No.: PCT/EP2021/073932
§ 371 (c)(1),
(2) Date: Feb. 24, 2023

(87) PCT Pub. No.: WO2022/043567
PCT Pub. Date: Mar. 3, 2022

(65) Prior Publication Data
US 2023/0323542 A1 Oct. 12, 2023

(30) Foreign Application Priority Data

Aug. 31, 2020 (EP) .................................... 20193722

(51) Int. Cl.
C23C 18/44 (2006.01)
C23C 18/12 (2006.01)
H05K 3/24 (2006.01)

(52) U.S. Cl.
CPC .......... C23C 18/44 (2013.01); C23C 18/1241 (2013.01); H05K 3/244 (2013.01)

(58) Field of Classification Search
CPC ...... C23C 18/44; C23C 18/1241; H05K 3/244
See application file for complete search history.

(56) References Cited

U.S. PATENT DOCUMENTS

| | | | |
|---|---|---|---|
| 3,285,754 A | 11/1966 | Hopkin | |
| 4,424,241 A | 1/1984 | Abys | |
| 6,336,962 B1 | 1/2002 | Backus et al. | |
| 7,704,307 B2 | 4/2010 | Aiba et al. | |
| 10,385,458 B2 | 8/2019 | Walter | |
| 2009/0044720 A1 | 2/2009 | Kojima et al. | |
| 2009/0081369 A1 | 3/2009 | Aiba et al. | |
| 2016/0053379 A1 | 2/2016 | Bruning et al. | |
| 2017/0042040 A1 | 2/2017 | Bengston | |
| 2017/0130337 A1 | 5/2017 | Yoshida et al. | |
| 2020/0095693 A1 | 3/2020 | Ehnert | |

FOREIGN PATENT DOCUMENTS

| | | |
|---|---|---|
| EP | 0698130 B1 | 4/1997 |
| JP | 11269658 A | 10/1999 |

OTHER PUBLICATIONS

PCT/EP2021/073932; International Search Report and Written Opinion of the International Searching Authority dated Sep. 30, 2021.

*Primary Examiner* — Robert S Walters, Jr.
(74) *Attorney, Agent, or Firm* — Renner, Otto, Boisselle & Sklar, LLP

(57) ABSTRACT

The present invention is directed to a composition for depositing a palladium coating on a substrate, in particular on a nickel-coated substrate, the composition comprising:
(i) palladium ions,
(ii) chloride ions,
(iii) ethylenediamine (EDA),
(iv) ethylenediamine disuccinate (EDDS), and
(v) at least one reducing agent.

10 Claims, No Drawings

COMPOSITION FOR DEPOSITING A PALLADIUM COATING ON A SUBSTRATE

This application is a national phase of International Application No. PCT/EP2021/073932, filed 31 Aug. 2021, which claims priority to European Patent Application No. 20193722.4, filed 31 Aug. 2020, each of which is hereby incorporated herein by reference in its entirety.

FIELD OF THE INVENTION

The present invention according to a first aspect relates to a composition for depositing a palladium coating on a substrate, in particular on a nickel-coated substrate, the composition comprising (i) palladium ions, (ii) chloride ions, (iii) ethylenediamine (EDA), (iv) ethylenediamine disuccinate (EDDS), and (v) at least one reducing agent.

According to a second aspect the present invention is further directed to a use of the composition according to the first aspect for depositing a pure palladium coating on a substrate, in particular on a nickel-coated substrate.

According to a third, aspect the present invention is further directed to a substrate, in particular a nickel-coated substrate, with a surface, wherein the surface of the substrate comprises a pure palladium coating obtained by a use of the composition according to the second aspect.

BACKGROUND OF THE INVENTION

Base metals can be protected against aggressive gases or liquids by means of corrosion resistant metal coatings, the type of which is determined essentially by the intended use of the article. For example in a welding wire, iron and/or steel are protected against rusting by thin copper layers, deposited thereon. In the electronics industry, gold is commonly used for coating surfaces to be bonded or soldered or surfaces for electrical contact. Silver is generally not used for corrosion protection due to its tendency to migrate.

Nickel coatings may also be used for corrosion protection of, for example, copper and copper alloys. First the surfaces are superficially activated. Then the article having the surfaces to be coated is dipped into an acidic palladium solution, so that extremely fine palladium particles are formed, on which the deposition of nickel starts. The palladium coating is not sealed but is very finely distributed. The palladium coated surfaces have a gray appearance. It is the subsequent nickel coating that seals the surface completely. However, the nickel coating layers are not resistant to oxidation. Thus, the nickel coated surfaces cannot be soldered or bonded after storage and are thus not suitable for providing corrosion protection to circuit boards.

For applications in which the corrosion-protection layer also serves as the final solderable and bondable layer, noble metals are primarily used. Various baths for the chemical deposition of palladium layers are known in the art.

U.S. Pat. No. 4,424,241 discloses a process for the chemical deposition of palladium. The process operates at a pH-value lower than 2 and uses formic acid, among other agents, as a reducing agent. Along with carboxylic acid, amines are disclosed as complexing agents; however, no information is given about the particular type of amines used. Comparative tests show that the palladium layers deposited from these baths are black and do not adhere satisfactorily to the substrate. Furthermore, the baths decompose very rapidly. It is also stated that the danger of spontaneous decomposition of the bath exists when the concentration of the reducing agent is set too high.

U.S. Pat. No. 3,285,754 discloses a cementation bath for the deposition of palladium on copper and copper alloys and other substrates. The bath contains nitrito-palladium complexes and operates in the pH range of between 2 and 5. The palladium complex also contains complex-bound acid anions such as, for example, sulfate, acetate and chloride. However, the layers produced with the bath are extraordinarily thin and contain pores.

EP patent EP 0 698 130 B1 discloses a method and bath for depositing palladium layers on metal surfaces, wherein the bath comprises a palladium salt, at least one nitrogen-containing complexing agent and methanoic acid or methanoic acid derivatives at a pH value above 4, and wherein the bath does not comprise formaldehyde.

U.S. Pat. No. 7,704,307 B2 discloses an electroless palladium plating liquid used for plating electronic components, wherein the plating liquid comprises a water-soluble palladium compound containing palladium, at least one of ammonia, an amine compound, an aminocarboxylic acid compound and a carboxylic acid as complexing agent, as well as bismuth or a bismuth compound as stabilizer.

However, in some conventional methods and treatment solutions it can be not possible to allow for an efficient deposition of palladium of areas to be wire bonded or areas to be soldered, in particular with a sometimes compromised solder joint integrity.

In some conventional methods and treatment solutions this impairment can be caused by a varying palladium deposition rate during the deposition process, an uneven thickness distribution of the palladium coating after deposition, or a quick deterioration of the chemicals of said conventional treatment solutions.

OBJECTIVES OF THE PRESENT INVENTION

It was therefore the first objective of the present invention to provide a composition and a use of such composition for depositing a palladium coating on a substrate, in particular on a nickel-coated substrate, as well as the resulting substrate, wherein an excellent wire-bonding, solderability and solder joint integrity to the palladium coated surface can be ensured in addition to an increased corrosion resistance of said palladium coating.

It was therefore the second objective of the present invention to provide a composition and a use of such composition for depositing a palladium coating on a substrate, in particular on a nickel-coated substrate, as well as the resulting substrate, wherein a constant palladium deposition rate can be ensured during deposition, wherein an increased thickness of the deposited palladium coating can be ensured after deposition, and wherein an even thickness distribution of the deposited palladium coating can be ensured after deposition.

It was therefore the third objective of the present invention to provide a composition and a use of such composition for depositing a palladium coating on a substrate, in particular on a nickel-coated substrate, as well as the resulting substrate, wherein an optimal palladium layer appearance can be guaranteed.

It was therefore the fourth objective of the present invention to provide a composition and a use of such composition for depositing a palladium coating on a substrate, in particular on a nickel-coated substrate, as well as the resulting substrate, wherein the respective composition provides a high metal turnover (MTO) to allow for an extended use of the respective composition without replacing the composition.

It was therefore the fifth objective of the present invention to provide a composition and a use of such composition for depositing a palladium coating on a substrate, in particular on a nickel-coated substrate, as well as the resulting substrate, wherein the amount of palladium in the composition can be efficiently reduced.

It was therefore the sixth objective of the present invention to provide a composition and a use of such composition for depositing a palladium coating on a substrate, in particular on a nickel-coated substrate, as well as the resulting substrate, wherein the composition does not experience any nickel ions contamination sensitivity during the deposition process.

SUMMARY OF THE INVENTION

The first to sixth objectives mentioned above are solved according to a first aspect by a composition for depositing a palladium coating on a substrate, in particular on a nickel-coated substrate, the composition comprising:

(i) palladium ions,
(ii) chloride ions,
(iii) ethylenediamine (EDA),
(iv) ethylenediamine disuccinate (EDDS), and
(v) at least one reducing agent.

The composition allows for an efficient depositing a palladium coating on a substrate, in particular on a nickel-coated substrate, wherein said palladium coating ensures an efficient corrosion protection of the substrate for an extended period of time to allow for a subsequent soldering or wire bonding of said substrate.

In particular, the composition according to the first aspect allows for a deposition of a palladium coating with optimal structural and optical properties, such as a high palladium thickness of preferably more than 400 nm, a significantly reduced variability of palladium thickness over the deposition area and an exceptionally fine crystalline structure of the palladium coating.

Moreover, the composition according to the first aspect allows for an efficient deposition of palladium of areas to be wire bonded or areas to be soldered, in particular by maintaining an optimal solder joint integrity.

The composition according to the first aspect shows an improved bath stability, which allows for a stable plating rate and performance of the bath life, which results in an increased metal turn over (MTO), which in turn corresponds to the number of times palladium ions can be added to the composition before the composition has to be replaced. Therefore, a robust and cost-saving handling of the composition according to the first aspect can be ensured.

Furthermore, the composition according to the first aspect has increased robustness against contamination, for example by nickel ions, which therefore allows for an efficient coating of a variety of substrates, in particular nickel substrates.

Moreover, the composition can be effectively used with a low concentration of palladium ions, for example 0.5 g/L, which allows for a significant cost reduction.

If desired, the composition according to the first aspect allows for a deposition of a pure palladium coating on a substrate, in particular on a nickel-coated substrate, wherein a pure palladium coating preferably comprises more than 98 wt.-% of palladium, more preferably more than 99 wt.-% of palladium, even more preferably more than 99.5 wt.-% of palladium, and most preferably more than 99.9 wt.-% of palladium. Therefore, a palladium coating with exceptional purity can be deposited on the substrate.

The first to sixth objectives mentioned above are solved according to a second aspect by a use of the composition according to the first aspect, if desired for depositing a pure palladium coating on a substrate, in particular on a nickel-coated substrate.

If desired, said use of the composition allows for a superior deposition of a pure palladium coating on the substrate.

The first to sixth objectives mentioned above are solved according to a third aspect by a substrate, in particular a nickel-coated substrate, with a surface, wherein the surface of the substrate comprises a pure palladium coating obtained by a use of the composition according to the second aspect.

Said substrate comprises a highly superior pure palladium coating.

BRIEF DESCRIPTION OF THE TABLES

In Tables 1, 2, 3, 4 and 5, the influence of variations in the various components according to differing test compositions in respect to their palladium deposition performance, represented as the palladium deposition rate (PDR) obtained during depositing a palladium coating on the substrate and the thickness variability (TV) of the deposited palladium coating, are shown.

In Table 1 (E1 to E5), the influence of palladium concentration, in Table 2 (E6 to E10) the influence of ethylenediamine succinate (EDDS) concentration, in Table 3 (E11 to E15) the influence of pH, in Table 4 (E16 to 20) the influence of halides, and in Table 5 (E21 to E25) the influence of ethylenediamine (EDA) have been analysed in respect to the palladium deposition performance of the respective test compositions.

Further details are given in the "Examples" section below in the text.

DETAILED DESCRIPTION OF THE INVENTION

In the context of the present invention, the term "at least one" or "one or more" denotes (and is exchangeable with) "one, two, three or more than three".

If not explicitly mentioned the term "palladium coating" refers to a pure palladium coating and to palladium coatings which can contain further elements as boron and/or phosphorus.

If not explicitly mentioned the term "nickel-coated substrate" refers to a pure nickel coated substrate and to nickel-coated substrate which can contain phosphorus. Preferred nickel-phosphorus-coated substrate having phosphorus content from 3 to 12% by weight, preferably from 7 to 9% by weight.

The present invention according to the first aspect provides a composition for depositing a palladium coating on a substrate, in particular on a nickel-coated substrate, the composition comprising:

(i) palladium ions,
(ii) chloride ions,
(iii) ethylenediamine (EDA),
(iv) ethylenediamine disuccinate (EDDS), and
(v) at least one reducing agent.

In particular, the composition comprises divalent, tetravalent and/or pentavalent palladiums ions, preferably divalent palladiums ions.

Preferably, the composition is an aqueous composition.

Preferably, the composition is for depositing a pure palladium coating on the substrate, wherein a pure palladium coating preferably comprises more than 98 wt.-% of palladium, more preferably more than 99 wt.-% of palladium, even more preferably more than 99.5 wt.-% of palladium, and most preferably more than 99.9 wt.-% of palladium.

One advantage, which is achieved by the composition for depositing a palladium coating on a substrate, in particular on a nickel substrate, results in a palladium coating with optimal structural and optical properties, such as a high palladium thickness of more than 400 nm, a significantly reduced variability of palladium thickness over the deposition area and an exceptionally fine crystalline structure of the palladium coating.

Said optimal structural and optical properties are in particular achieved by maintaining a relatively constant palladium deposition rate during the palladium deposition process, for example with a palladium deposition rate of about 20-30 nm/min.

The use of chloride ions, ethylenediamine (EDA) and ethylenediamine succinate (EDDS) in the composition allows for an efficient stabilization of the palladium ions by complexation, respectively chelatization. Said stabilization allows for the composition according to the present invention to be used for an extended period of time solely by replenishing the deposited palladium ions, thereby resulting in an environmentally friendly and cost effective process due to the reduction of the amount of wastewater, which is produced during the process.

Also, the composition according to the present invention can be used with a minimal concentration of palladium ions, for example 0.5 g/L, thereby also leading to a significant cost reduction of the process.

Preferably, the at least one reducing agent is selected from the group consisting of formic acid, a formate salt, a formate derivative, formaldehyde, hypophosphite, amine borane compound wherein formic acid, a formate salt, a formate derivative and formaldehyde are preferred.

When selecting formic acid, a formate salt, a formate derivative and/or formaldehyde as the at least one reducing agent, an exceptional pure palladium coating can be deposited on the substrate, preferably with more than 98 wt.-% of palladium, more preferably more than 99 wt.-% of palladium, even more preferably more than 99.5 wt.-% of palladium, and most preferably more than 99.9 wt.-% of palladium.

Phosphorus containing reducing agent such as sodium hypophosphite and/or derivate thereof provide phosphorus-containing palladium coatings. Use of amine boranes as reducing agent leads to boron-containing palladium coatings.

The components of the composition according to the present invention, in particular the palladium ions, the chloride ions, the ethylenediamine (EDA), the ethylenediamine disuccinate (EDDS), and/or the at least one reducing agent can be provided as salts, preferably for e.g. sodium formate, which are added to the composition.

According to the present invention, salts include, but are not limited to, alkaline metal salts such as sodium salt, potassium salt and the like; alkaline earth metals such as calcium salt, magnesium salt; inorganic acid salts such as chloride, hydrochloride, sulfate, phosphate and the like; organic acid salts such as formate, acetate, trifluoroacetate, maleate, tartrate and the like; sulfonates such as methanesulfonate, benzenesulfonate, p-toluenesulfonate, and the like; amino acid salts such as arginate, asparginate, glutamate and the like.

A composition for depositing a palladium coating on a substrate, in particular on a nickel-coated substrate is preferred, wherein the composition has a pH in a range from 5.5 to 6.8, preferably from 5.6 to 6.7, more preferably from 5.7 to 6.6, and most preferably from 5.8 to 6.5.

By selecting the preferred pH ranges of the composition, a particularly effective palladium deposition process can be ensured. When the pH of the composition would be too basic, i.e. with pH values of 7.0 or more, or too acidic, i.e. with pH values of 5.0 or less, the effectivity of the palladium deposition process would be impaired.

Preferably for establishing the preferred pH ranges, an acidic salt, more preferably sodium hydrogensulfate, and/or an acid, more preferably sulfuric acid, and/or hydrochloric acid, or sodium hydroxide or potassium hydroxide may be added to the composition.

A composition for depositing a palladium coating on a substrate, in particular on a nickel-coated substrate is preferred, wherein the composition comprises the palladium ions in a total concentration in a range from 0.3 g/L to 2.0 g/L, based on the total volume of the composition, preferably from 0.4 g/L to 1.5 g/L, more preferably from 0.4 g/L to 1.0 g/L, even more preferably from 0.4 g/L to 0.6 g/L, and most preferably the total concentration of the palladium ions is 0.5 g/L based on the total volume of the composition.

The composition according to the present invention can be effective with a very low concentration of palladium ions, for example with a concentration of 0.5 g/L or even 0.4 g/L of palladium ions based on the total volume of the composition. Thereby, by reducing the amount of palladium ions in the composition, the cost of the process can be significantly reduced.

While the upper limit of palladium ion concentration can be increased to a concentration range of up to 2.0 g/L or even more without negatively affecting the palladium deposition process, the lower limit of palladium ion concentration is about 0.3 g/L. When decreasing the palladium ion concentration below 0.3 g/L, for example to 0.25 g/L or even less, the palladium deposition rate is significantly decreased and the thickness variability of the deposited palladium coating is increased, thereby resulting in an inferior quality palladium coating.

A composition for depositing a palladium coating on a substrate, in particular on a nickel-coated substrate is preferred, wherein in the composition the ratio of palladium ions to ethylenediamine (EDA) is from 1:2 to 1:6, preferably from 1:3 to 1:5, more preferably from 1:4 to 1:5, and most preferably in the composition the ratio of palladium ions to ethylenediamine (EDA) is 1:4.5.

The ratio of palladium ions to ethylenediamine (EDA) is of particular influence in respect to the stabilization of palladium ions in solution, thereby also affecting the palladium deposition process on the substrate. When a too low ratio of ethylenediamine (EDA) in respect to palladium ions is used not all of the available palladium ions are complexed and hence tending to precipitate, while when a too high ratio of ethylenediamine (EDA) in respect to palladium ions is used the excess of ethylenediamine (EDA) negatively affects the palladium deposition process.

A composition for depositing a palladium coating on a substrate, in particular on a nickel-coated substrate is preferred, wherein the composition comprises palladium chloride and/or palladium sulfate to provide the palladium ions, wherein the composition preferably comprises palladium sulfate.

By providing palladium chloride and/or palladium sulfate, preferably palladium sulfate, an effective source for palladium ions of the composition could be provided. For example, if the concentration of palladium ions in the composition is decreased during the palladium deposition process, the palladium ions deposited can be advantageously replenished by adding the respective concentration of palladium chloride and/or palladium sulfate, preferably during a constantly performed replenishing process.

A composition for depositing a palladium coating on a substrate, in particular on a nickel-coated substrate is preferred, wherein the composition comprises sodium chloride and/or potassium chloride to provide the chloride ions, wherein the composition preferably comprises sodium chloride.

By providing sodium chloride and/or potassium chloride, preferably sodium chloride, an effective source for chloride ions of the composition could be provided to allow for an effective stabilization of palladium ions in the composition.

A composition for depositing a palladium coating on a substrate, in particular on a nickel-coated substrate is preferred, wherein the composition comprises the ethylenediamine (EDA) in a total concentration in a range from 10 mM to 75 mM, preferably from 15 mM to 60 mM, more preferably from 15 mM to 50 mM, even more preferably from 15 mM to 25 mM, most preferably from 20 mM to 25 mM, and even most preferably the composition comprises the ethylenediamine (EDA) in a total concentration of 22.5 mM.

As previously described, an optimal concentration of ethylenediamine (EDA), which functions as a complexing agent for palladium ions, is advantageous to allow for an effective palladium deposition to occur. When the concentration of ethylenediamine (EDA) is significantly increased beyond 75 mM or is significantly decreased below 10 mM a negative effect on palladium deposition can be observed.

A composition for depositing a palladium coating on a substrate, in particular on a nickel-coated substrate is preferred, wherein the composition comprises the chloride ions in a total concentration in a range from 25 mM to 200 mM, preferably from 25 mM to 150 mM, more preferably from 25 mM to 100 mM, even more preferably from 25 mM to 75 mM, most preferably from 30 mM to 60 mM and even most preferably the composition comprises the chloride ions in a total concentration of 50 mM.

By providing the respective preferred concentration ranges of chloride ions in the composition an optimized palladium deposition could be ensured.

A composition for depositing a palladium coating on a substrate, in particular on a nickel-coated substrate is preferred, wherein the composition does not comprise any bromide ions, iodine ions and/or fluoride ions.

Since the addition of bromide ions, iodine ions and/or fluoride ions significantly impairs the palladium deposition process, by omitting bromide ions, iodine ions and/or fluoride ions an optimized palladium deposition could be ensured. In particular, the composition according to the present invention does not comprise bromide ions, does not comprise iodine ions and does not comprise fluoride ions.

A composition for depositing a palladium coating on a substrate, in particular on a nickel-coated substrate is preferred, wherein the composition comprises the ethylenediamine disuccinate (EDDS) in a total concentration in a range from 5 mM to 60 mM, preferably from 5 mM to 30 mM, more preferably from 5 mM to 15 mM, and most preferably the composition comprises the ethylenediamine disuccinate (EDDS) in a total concentration of 5 mM to 10 mM.

The addition of ethylenediamine disuccinate (EDDS) to the composition allows for an effective stabilization of palladium ions in the composition by complexation, i.e. chelatization, in particular in the preferred concentration ranges. When the concentration of ethylenediamine disuccinate (EDDS) is significantly increased beyond 60 mM or below 5 mM, the palladium deposition process is significantly impaired.

A composition for depositing a palladium coating on a substrate, in particular on a nickel-coated substrate is preferred, wherein the reducing agent comprises format ions, wherein preferably the reducing agent is selected as sodium formate, potassium formate and/or ammonium formate.

Preferably, the reducing agent comprises formic acid, esters of formic acid, more preferably formic acid ethyl ester, substituted and non-substituted amines of formic acid, more preferably formamide and/or N,N-dimethyl formamide, the salts of formic acid, more preferably sodium formate, and/or activated formic acid, more preferably orthoformic acid.

As the cations of the salts of formic acid, the elements of the first, second and third major groups, especially lithium, sodium, potassium, magnesium, calcium, and aluminum may be preferably used. Furthermore, formates that comprise ammonium or quaternary ammonia compounds as the cation may be used.

Formate ions as reducing agents are non-toxic, and only hydrogen and carbon dioxide are produced as non-toxic side products during the reaction, which diffuse out of the composition during the deposition process and can therefore be effectively removed from the composition.

A composition for depositing a palladium coating on a substrate, in particular on a nickel-coated substrate is preferred, wherein the composition comprises the reducing agent, in particular the formate ions, in a total concentration in a range from 200 mM to 1000 mM, preferably from 300 mM to 600 mM, more preferably from 450 mM to 550 mM, and most preferably the composition comprises the reducing agent, preferably the formate ions, in a total concentration of 500 mM.

When using format ions, preferably sodium formate, potassium formate and/or ammonium formate, preferably in the preferred concentration ranges, as reducing agent, deposition of a pure palladium coating on the substrate can be achieved.

A composition for depositing a palladium coating on a substrate, in particular on a nickel-coated substrate is preferred, wherein the composition comprises a concentration of nickel ions of less than 70 ppm, preferably less than 60 ppm, more preferably less than 50 ppm, even more preferably less than 40 ppm, and most preferably less than 30 ppm.

The composition according to the present invention is preferably robust in respect to the presence of nickel ions, thereby allowing for an effective deposition of the palladium coating in particular on nickel substrates.

A composition for depositing a palladium coating on a substrate, in particular on a nickel-coated substrate is preferred, wherein the composition provides a metal turn over (MTO) up to 10, preferably up to 20, wherein the metal turn over (MTO) corresponds to the number of times palladium ions can be added to the composition during deposition before the composition has to be replaced.

Due to the high metal turn over (MTO) of the composition according to the present invention, the same composition could be used for multiple times on different substrates without replacing the overall composition, wherein only the deposited palladium ions have to be replenished. Thereby, the cost of the deposition process and a wastewater amount can be effectively decreased.

If the composition is used again, the replenishment solution contains at least palladium ions, ethylenediamine (EDA) and chloride ions. In case the composition provides a MTO of 20 due to the replenishment, the concentration of chloride can be enriched up to 500 mM; the concentration of EDA is enriched up to 250 mM, wherein the composition is still working.

A composition for depositing a palladium coating on a substrate, in particular on a nickel-coated substrate is preferred, wherein the composition does not comprise any boron hydride and/or phosphite compounds.

By omitting boron hydride and/or phosphite compounds in the composition an optimized palladium deposition process can be ensured.

The present invention according to the second aspect provides a use of the composition according to the first aspect, for depositing a palladium coating, preferably a pure palladium coating, on a substrate, in particular on a nickel-coated substrate. Preferably the composition is directly used after the substrate was coated with nickel. This avoids corrosion or contamination of the substrate. Before using the composition, the freshly nickel-coated substrate is preferably rinsed with water.

After using the composition the nickel-coated substrate having a palladium coating, the substrate can be further coated with a gold with an immersion gold bath.

The use according to the second aspect ensures an effective palladium deposition process.

Preferably, the use according to the second aspect comprises circuit board manufacturing, production of electronic components, such as hybrid circuits and substrates for integrated circuits in which the palladium coatings are generally applied to copper and/or nickel surfaces, and the production of microelectrode arrays. Furthermore, palladium coatings of this type may also be used in corrosion protection and solder protection layers.

A use of the present invention is preferred, wherein the use provides a metal turn over (MTO) up to 10, preferably up to 20, wherein the metal turn over (MTO) corresponds to the number of times palladium ions can be added to the composition during deposition before the composition has to be replaced.

Due to the high metal turn over (MTO) of the composition according to the present invention, the same composition could be used for multiple times on different substrates without replacing the overall composition, wherein only the deposited palladium ions have to be replenished.

A use of the present invention is preferred, wherein the temperature of the composition for depositing a palladium coating on a substrate, in particular on a nickel-coated substrate, is from 45° C. to 75° C., preferably from 50° C. to 70° C., more preferably from 52° C. to 65° C., even more preferably from 54° C. to 63° C., and most preferably from 55° C. to 60° C.

By performing the use of the present invention in the preferred temperature ranges, a highly efficient palladium deposition can be achieved.

A use of the present invention is preferred, wherein the composition is used for depositing a palladium coating on a substrate, in particular on a nickel-coated substrate, with a constant deposition rate during the deposition process, preferably with a deposition rate of 20-30 nm/min.

A constant deposition rate is advantageous for the palladium deposition process, since it allows for an even distribution of palladium on the surface of the substrate, thereby resulting in a decreased thickness variability of the deposited palladium coating.

Preferably, the deposition is carried out in conventional immersion units, in which the substrate to be treated, in particular the nickel-coated substrate, is immersed substantially in the vertical direction in the composition. However, it may be also contemplated that the substrate may be moved through a treatment unit in the horizontal direction and a least a portion of the substrate comes into contact with the composition, for example in a metallization unit for the selective metallization of contact areas on circuit boards.

A use of the present invention is preferred, wherein the composition is used for depositing a pure palladium coating on a substrate, in particular on a nickel-coated substrate, wherein the pure palladium coating comprises at least 98% of palladium, preferably between 99% and 99.9% of palladium.

A pure palladium coating preferably comprises more than 98 wt.-% of palladium, more preferably more than 99 wt.-% of palladium, even more preferably more than 99.5 wt.-% of palladium, and most preferably more than 99.9 wt.-% of palladium, since it ensures optimal functional and structural properties of the palladium coating.

A use of the present invention is preferred, wherein the composition is an electroless depositing composition for depositing a palladium coating on a substrate, in particular on a nickel-coated substrate, without applying any voltage to the composition.

An electroless deposition allows for an easy-to-perform and cost-effective palladium deposition process.

A use of the present invention is preferred, wherein the composition is used for depositing a palladium coating on a substrate, in particular on a nickel-coated substrate, for a time period from 3 minutes to 30 minutes, preferably from 5 minutes to 25 minutes, and most preferably for a time period from 8 minutes to 20 minutes.

The preferred time intervals allow for an efficient palladium deposition process.

A use of the present invention is preferred, wherein the thickness of the deposited palladium coating according to customer requirements is more than 50 nm, preferably more than 200 nm, more preferably more than 300 nm and most preferably more than 400 nm.

Preferably, the aforementioned regarding the composition according to the first aspect of the present invention, preferably what is described as being preferred, applies likewise to the use of the composition of the second aspect of the present invention and vice versa.

According to a third aspect the present invention is further directed to a substrate, in particular a nickel-coated substrate, with a surface, wherein the surface of the substrate comprises a palladium coating, preferably pure palladium coating, obtained by a use of the composition according to the second aspect.

Preferably, the aforementioned regarding the composition according to the first aspect of the present invention and the use according to the second aspect, preferably what is described as being preferred, applies likewise to the substrate of the third aspect of the present invention.

EXAMPLES

Respective test compositions were prepared freshly comprising E1 to E25 (weight: appr. 0.27 g/L-0.53 g/L $Pd^{2+}$) between 2.5 mM and 5.0 mM of palladium ions (e.g. palladium sulfate or palladium chloride as palladium source) (see Table 1, E1 to E5), from 5 mM to 60 mM ethylenediamine disuccinate (EDDS) (see Table 2, E6 to E10), a pH in a range from 5.0 to 7.0 (see Table 3, E11 to 15), from 25 mM to 200 mM chloride or 50 mM bromine or 10 mM iodine (see Table 4, E16 to E20), from 5 mM to 75 mM of ethylenediamine (EDA) (see Table 5, E21 to E25), and 500 mM sodium formate as reducing agent.

In each test, a piece of SFTB1 test vehicle (size of 142 mm×240 mm) comprising a fresh deposited nickel or nickel-phosphorus surface at both sides, and which has rinsed, is immersed into the respective test composition for 8-20 minutes to achieve palladium thickness of 160 nm-400 nm respectively at a temperature of 55° C.

For evaluating the efficiency of palladium deposition, the palladium deposition rate (PDR, nm/min) of the respective test composition was determined based on thickness measurements by XRF, and the thickness variability (TV) of the palladium coating deposited on the substrate of the respective test composition was determined based on the coefficient of variance (CV), which is based on statistics theory. The coefficient of variance is defined as the ratio of the standard deviation to the mean and expressed usually in percentage.

The results shown in Tables 1 to 5 for palladium deposition rate and thickness variability are qualitatively ranked having the following synonyms:

+++ Excellent
++ Good
+ Medium
– Bad

TABLE 1

| | Influence of palladium concentration on palladium deposition | | |
|---|---|---|---|
| Exp. | Palladium concentration ([mM]) | PDR (nm/min) | TV (%) |
| E1 | 2.5 | – | – |
| E2 | 3.0 | + | + |
| E3 | 3.5 | ++ | ++ |
| E4 | 4.0 | +++ | +++ |
| E5 | 5.0 | +++ | +++ |

Test compositions E1 to E5 comprise between 2.5 mM and 5.0 mM of palladium ions, 11.25-22.5 mM of ethylenediamine (EDA) with ratio 1:4.5 of palladium to EDA, 7.5 mM ethylenediamine disuccinate (EDDS), 50 mM chloride, and 500 mM of formate as reducing agent at pH of 5.8.

As shown in Table 1, lowering the concentration of palladium ions from 5 mM (E5) to 2.5 mM (E1) results in a significant decrease in palladium deposition rate (PDR) and results in a significant increase of thickness variability (TV) of the palladium coating.

TABLE 2

| | Influence of ethylenediamine succinate (EDDS) concentration on palladium deposition | | |
|---|---|---|---|
| Exp. | EDDS concentration ([mM]) | PDR (nm/min) | TV (%) |
| E6 | 5 | +++ | +++ |
| E7 | 10 | +++ | +++ |
| E8 | 15 | ++ | ++ |
| E9 | 30 | + | + |
| E10 | 60 | – | – |

Test compositions E6 to E10 comprise 5 mM of palladium ions, from 5 mM to 60 mM of ethylenediamine disuccinate (EDDS), 50 mM chloride, 22.5 mM of ethylenediamine (EDA), and 500 mM of formate as reducing agent at pH of 5.8.

As shown in Table 2, increasing the concentration of ethylenediamine succinate (EDDS) from 5 mM (E6) to 10 mM (E7) to 15 mM (E8) to 30 mM (E9) and even to 60 mM (E10) results in a significant decrease in palladium deposition rate (PDR) and also results in a significant increase of thickness variability (TV) of the palladium coating.

TABLE 3

| | Influence of pH on palladium deposition | | |
|---|---|---|---|
| Exp. | pH | PDR (nm/min) | TV (%) |
| E11 | 5.0 | – | – |
| E12 | 5.8 | +++ | +++ |
| E13 | 6.5 | +++ | +++ |
| E14 | 6.8 | ++ | ++ |
| E15 | 7.0 | – | – |

Test compositions E11 to E15 comprise 5.0 mM of palladium ions, 5 mM of ethylenediamine disuccinate (EDDS), a pH between 5.0 and 7.0, 50 mM chloride, 22.5 mM of ethylenediamine (EDA), and 500 mM of formate as reducing agent.

As shown in Table 3, the optimal palladium deposition rate (PDR) and thickness variability (TV) of the palladium coating can be observed in a pH range between 5.8 (E12) and 6.5 (E13), while a pH of 5.0 (E11) or less leads to a significant bath instability. On the other hand pH value of 6.8 (E14) or 7.0 (E15) or higher results in a significant decrease in palladium deposition rate (PDR) or even no palladium plating and also results in a significant increase of thickness variability (TV) of the palladium coating.

TABLE 4

| | Influence of halides on palladium deposition | | |
|---|---|---|---|
| Exp. | halide ([mM]) | PDR (nm/min) | TV (%) |
| E16 | 25 mM chloride | +++ | +++ |
| E17 | 100 mM chloride | +++ | +++ |
| E18 | 200 mM chloride | +++ | +++ |
| E19 | 50 mM bromine | – | – |
| E20 | 10 mM iodine | – | – |

Test compositions E16 to E20 comprise 5 mM of palladium ions, 5 mM of ethylenediamine disuccinate (EDDS), between 25 mM (E16) and 200 mM (E18) chloride or 50 mM bromide (E19) or 10 mM iodide (E20), 22.5 mM of ethylenediamine (EDA), and 500 mM of formate as reducing agent at pH of 5.8.

As shown in Table 4, the chloride concentration over a wide concentration range from 25 mM (E16) chloride to 200 mM chloride (E18) allows for an excellent palladium deposition, according to excellent palladium deposition rates and thickness variability, while replacing chloride with bromine (E19) or iodine (E20) totally impairs the palladium deposition process.

TABLE 5

| | Influence of ethylenediamine (EDA) concentration on palladium deposition | | |
|---|---|---|---|
| Exp. | ethylenediamine (EDA) ([mM]) | PDR (nm/min) | TV (%) |
| E21 | 10 mM | ++ | ++ |
| E22 | 20 mM | +++ | +++ |

TABLE 5-continued

| | Influence of ethylenediamine (EDA) concentration on palladium deposition | | |
| | ethylenediamine (EDA) | PDR | TV |
| Exp. | ([mM]) | (nm/min) | (%) |
| --- | --- | --- | --- |
| E23 | 25 mM | +++ | +++ |
| E24 | 75 mM | + | + |
| E25 | 150 mM | – | – |

Test compositions E21 to E25 comprise 5.0 mM of palladium ions, 5 mM of ethylenediamine disuccinate (EDDS), 50 mM chloride, between 10 mM and 150 mM of ethylenediamine (EDA), and 500 mM of formate as reducing agent at pH of 5.8.

As shown in Table 5, the ethylenediamine (EDA) concentration over a concentration range from 10 mM (E21) to 25 mM (E23) allows for an excellent palladium deposition, according to excellent palladium deposition rates and thickness variability, while ethylenediamine (EDA) concentration of 75 mM leads to a significant drop of palladium deposition rate and poor thickness variability, while 150 mM (E25) or higher impairs the palladium deposition process.

The invention claimed is:

1. A composition for depositing a palladium coating on a substrate, the composition comprising:
(i) palladium ions,
(ii) chloride ions,
(iii) ethylenediamine (EDA),
(iv) ethylenediamine disuccinate (EDDS), and
(v) at least one reducing agent,
wherein in the composition the ratio of palladium ions to ethylenediamine (EDA) is from 1:2 to 1:6, and wherein the composition has a pH in a range from 5.5 to 6.8.

2. The composition according to claim 1, wherein the composition comprises the palladium ions in a total concentration in a range from 0.3 g/L to 2.0 g/L, based on the total volume of the composition.

3. The composition according to claim 1, wherein in the composition the ratio of palladium ions to ethylenediamine (EDA) is from 1:3 to 1:5.

4. The composition according to claim 1, wherein the composition comprises the ethylenediamine (EDA) in a total concentration in a range from 10 mM to 75 mM.

5. The composition according to claim 1, wherein the composition comprises the chloride ions in a total concentration in a range from 25 mM to 200 mM.

6. The composition according to claim 1, wherein the composition comprises the ethylenediamine disuccinate (EDDS) in a total concentration in a range from 5 mM to 60 mM.

7. The composition according to claim 1, wherein the composition comprises the reducing agent in a total concentration in a range from 200 mM to 1000 mM.

8. The composition according to claim 1, wherein the composition does not comprise any boron hydride, any phosphite compounds, or does not comprise either boron hydride or phosphite compounds.

9. A method of depositing a pure palladium coating on a substrate, comprising contacting the substrate with the composition of claim 1.

10. The method according to claim 9, wherein the composition provides a metal turn over (MTO) up to 20, wherein the metal turn over (MTO) corresponds to the number of times palladium ions can be added to the composition during deposition before the composition has to be replaced.

\* \* \* \* \*